Figure 1:
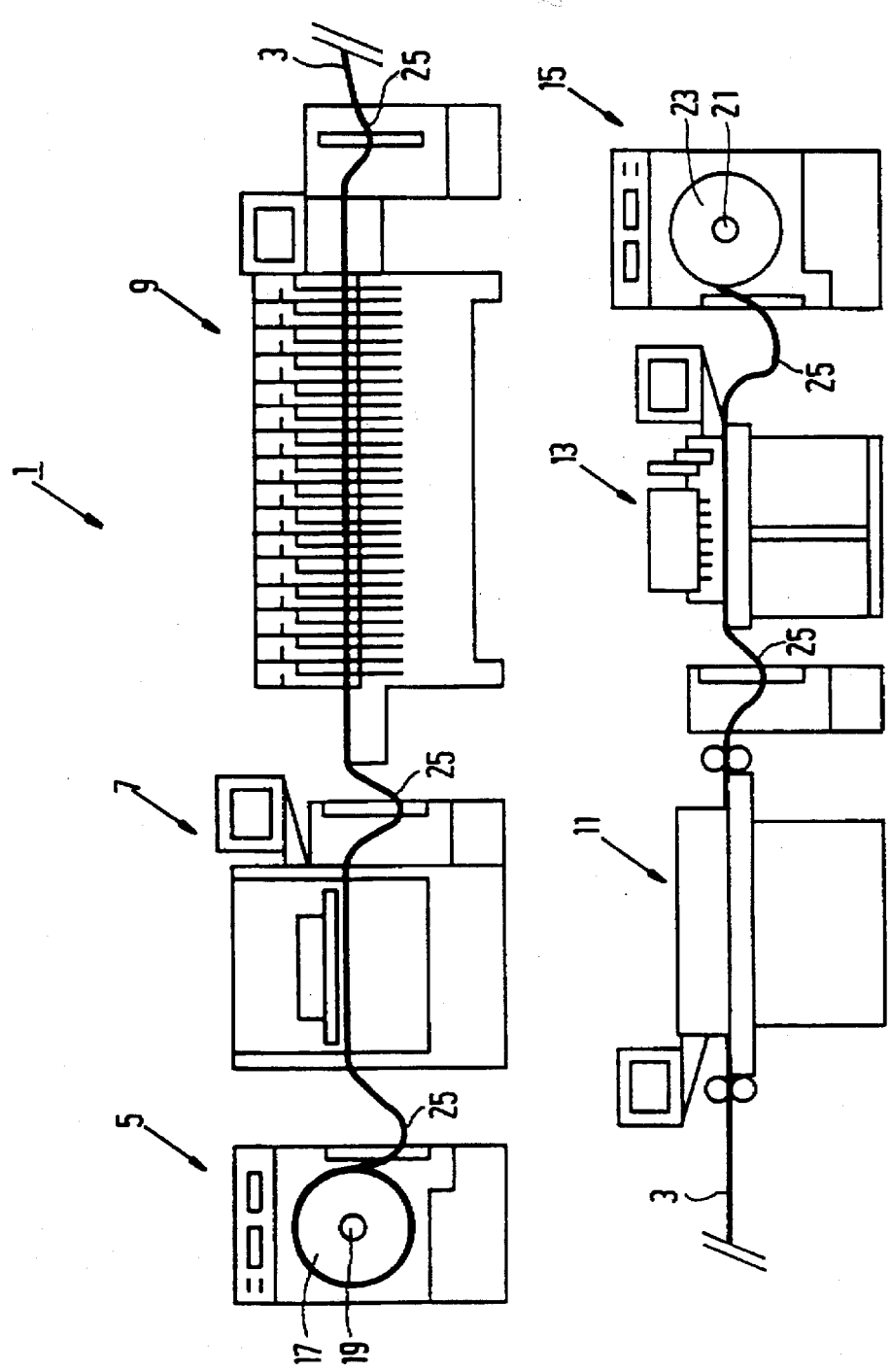

United States Patent [19]

Vos

[11] Patent Number: 5,680,699

[45] Date of Patent: Oct. 28, 1997

[54] METHOD AND APPARATUS FOR PLACING A COMPONENT ON A STRIP-SHAPED SUPPORT

[76] Inventor: Jan Vos, Groenewoudseweg 1, 5621 BA Eindhoven, Netherlands

[21] Appl. No.: 688,581

[22] Filed: Jul. 30, 1996

Related U.S. Application Data

[63] Continuation of Ser. No. 353,417, Dec. 9, 1994, abandoned.

[30] Foreign Application Priority Data

Dec. 10, 1993 [BE] Belgium ............................. 09301370

[51] Int. Cl.⁶ ........................... H05K 3/30; B23P 23/00
[52] U.S. Cl. ............................. 29/833; 29/564; 29/832
[58] Field of Search ........................... 29/827, 832, 833, 29/564

[56] References Cited

U.S. PATENT DOCUMENTS

| | | | |
|---|---|---|---|
| 3,698,618 | 10/1972 | Helda | 29/827 X |
| 3,724,068 | 4/1973 | Galli | 29/833 |
| 3,949,925 | 4/1976 | Keizer et al. | 29/827 X |
| 4,624,358 | 11/1986 | Satou | 29/827 X |
| 5,295,296 | 3/1994 | Hagiwara et al. | 29/827 |

FOREIGN PATENT DOCUMENTS

| | | | |
|---|---|---|---|
| 3-288499 | 12/1991 | Japan | 29/833 |
| 5-74865 | 3/1993 | Japan | 29/827 |

OTHER PUBLICATIONS

"Fast Component Mounter" from Philips Electronics N.V., Jun. 1993.

Primary Examiner—Carl J. Arbes

[57] ABSTRACT

A method and device for placing a component on an elongate, strip-shaped support which is provided with indexing holes and with a repetitive pattern, the positions of the patterns relative to indexing holes situated near an imaging device and positioned by means of pins being determined by means of this imaging device, after which the positions of the patterns relative to a component placement device are calculated, and subsequently a component is placed on a pattern in a desired position.

6 Claims, 4 Drawing Sheets

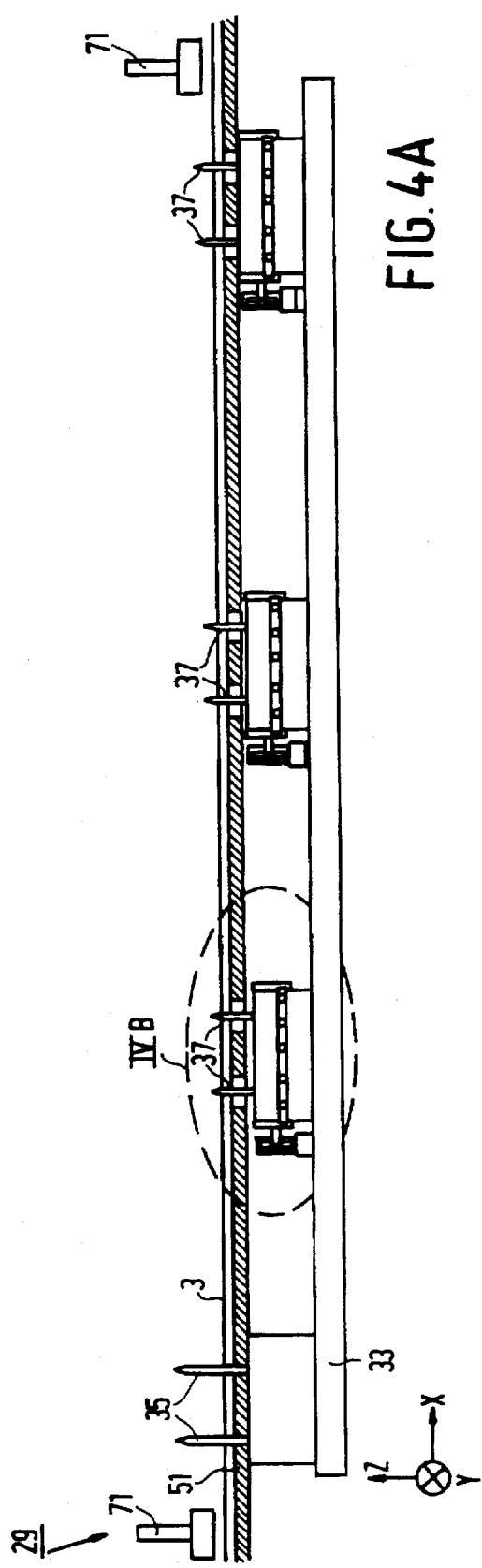
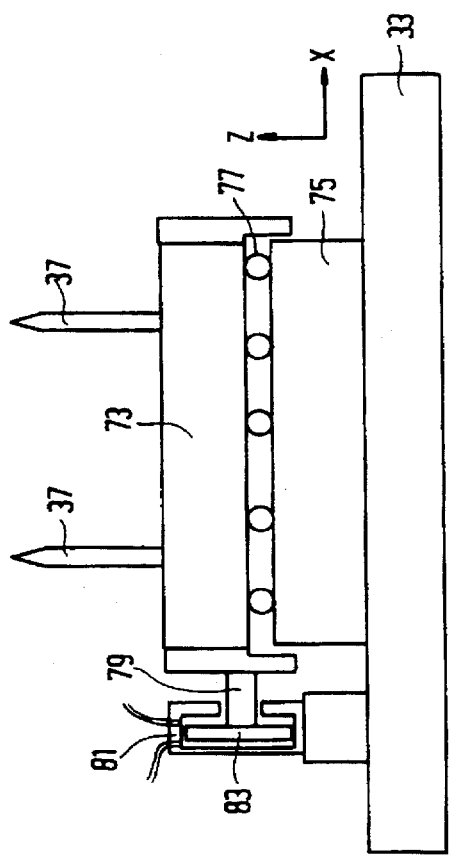
FIG. 4A
FIG. 4B

METHOD AND APPARATUS FOR PLACING A COMPONENT ON A STRIP-SHAPED SUPPORT

This is a continuation of application Ser. No. 08/353,417, filed Dec. 9, 1994, now abandoned.

The invention relates to a method of placing a component on a strip-shaped support which is provided with indexing holes and with a pattern which extends over a region corresponding to a series of indexing holes with a pitch S, the position of the pattern in relation to the indexing holes being determined by means of an imaging device, after which the strip-shaped support is transported by means of pins inserted into the indexing holes to a component placement device where subsequently a component is placed in a desired position on the pattern.

The invention also relates to a device for placing a component on a strip-shaped support.

Such a method and device are known from the brochure "Fast Component Mounter" from Philips Electronics N.V., June 1993. Here a printed circuit board (the support) is aligned by means of positioning pins inserted into indexing holes of the printed circuit board, and the position of a pattern on the board relative to the indexing holes is determined by means of an imaging device. Then the board is displaced to a component placement device by means of the positioning pins. In the component placement device, an electronic component is placed on the pattern of the board in the desired position. Subsequently the printed circuit board is displaced to a different position in the component placement device or to a position in which the board is removed from the component placement device.

A number of problems as described below occur especially when the device is used for placing components on a comparatively long, strip-shaped support, a portion of the support being situated below the imaging device while another portion of the support is situated in the component placement device, and the distance between the imaging device and the component placement device is comparatively great (for example, 2 m).

Although the indexing holes are provided accurately in the strip-shaped support, a comparatively small tolerance in the pitch between every two adjacent indexing holes will lead to a comparatively great error given the number of pitch distances over the comparatively great distance between the imaging device and the component placement device. In addition, these tolerances in the pitch will have the effect that the strip-shaped support will not optimally fit all pins, in spite of the fact that the pins are usually constructed so as to be self-locating. If the strip-shaped support is forced onto the pins, this will lead to fracture or creasing of the strip-shaped support, as a result of which components cannot be placed accurately on the strip-shaped support.

The invention has for its object to provide a method whereby the components can nevertheless be positioned with accuracy in spite of the above problems.

The method according to the invention is for this purpose characterized in that the support is provided with a number of repetitive patterns, the positions of the patterns being determined by the imaging device in relation to the indexing holes which are situated in the vicinity of the imaging device and which are positioned by means of pins, after which the positions of the patterns in relation to the component placement device are calculated.

In this case, the indexing holes in the vicinity of the imaging device only have to be positioned with accuracy. The remainder of the strip-shaped support is positioned relative to these indexing holes, for example, by means of flexible pins which are inserted into the remaining indexing holes. The positions of the patterns on the strip-shaped support are calculated relative to the indexing holes situated in the vicinity of the imaging device.

An embodiment of the method according to the invention is characterized in that a first pattern is positioned relative to the imaging device by means of pins which are inserted into indexing holes situated in the vicinity of the first pattern, after which the position of the first pattern relative to the indexing holes situated in the vicinity of the first pattern is determined, subsequently the position of a mark of the strip-shaped support relative to the imaging device is determined, after which a second pattern is positioned relative to the imaging device instead of the first pattern by means of the pins which are inserted into indexing holes situated in the vicinity of the second pattern, again the position of the mark of the strip-shaped support relative to the imaging device is determined, after which the displacement of the support as a result of the positioning of the second pattern instead of the first pattern is derived from the positions of the mark in relation to the imaging device, and subsequently the position of the first pattern relative to the indexing holes situated in the vicinity of the second pattern is calculated.

The mark may be, for example, a portion of the pattern or an indexing hole. During accurate positioning of the indexing holes situated in the vicinity of the second pattern, the strip-shaped support will perform a movement as a result of deviations in the expected distance between the indexing holes situated in the vicinity of the second pattern and the indexng holes situated in the vicinity of the first pattern. The movement can be determined from the two measured positions of the mark in relation to the imaging device. The position of the first pattern relative to the indexing holes situated in the vicinity of the second pattern may be determined comparatively quickly and with a comparatively high accuracy in this manner.

Another embodiment of the method according to the invention is characterized in that the position of a first pattern relative to a second pattern is determined, then the position of the second pattern relative to the indexing holes situated in the vicinity of the second pattern is determined, and after that the position of the first pattern relative to the indexing holes situated in the vicinity of the second pattern is calculated.

Here the positional relation between the patterns is determined directly, and subsequently the position of the first pattern relative to the accurately positioned indexing holes in the vicinity of the second pattern is calculated.

A further embodiment of the method according to the invention is characterized in that the position of the first pattern relative to the second pattern is determined for different positions in relation to the imaging device, after which an average relative position is calculated.

The relative positions of the patterns are determined more accurately in this way.

Another embodiment of the method according to the invention is characterized in that a number of components are placed substantially simultaneously on different patterns on the component placement device.

Since the positions of a number of patterns relative to the indexing holes situated in the vicinity of the imaging device are known, components may be placed simultaneously on different patterns, whereby the strip-shaped support can be provided with components comparatively quickly.

The invention also has for its object to provide a device by which the disadvantages of the known device are avoided.

According to the invention the device for placing a component on a strip-shaped support provided with indexing holes and with a pattern extending over a region corresponding to a series of indexing holes with a pitch S, is provided with an imaging device, a component placement device, and a transport device for displacing a strip-shaped support in a transport direction, which transport device is provided with positioning pins situated in the vicinity of the imaging device for positioning the support, is for this purpose characterized in that the transport device is further provided with transport pins which are displaceable in the transport direction relative to the positioning pins for positioning the support relative to the positioning pins in the transport direction.

The strip-shaped support can be transported by means of the positioning pins inserted into the indexing holes of the strip-shaped support and the transport pins. The positioning pins position the strip-shaped support in and transverse to the transport direction, while the transport pins only position the strip-shaped support in a direction transverse to the transport direction. The transport pins are inserted into the indexing holes and then displaced in the transport direction, whereby the strip-shaped support is tautened. The distance between the positioning pins and the transport pins is adapted by the displaceable transport pins to the distance between the indexing holes present around the positioning pins and around the transport pins, which distance deviates from an expected distance owing to tolerances in the pitch. The positions of all patterns are fixed relative to the positioning pins and can be determined from pictures made by means of the imaging device. The positions of the patterns relative to the component placement device can subsequently be calculated.

An embodiment of the device according to the invention is characterized in that the device is provided with a clamping mechanism for tautening the support, which is to be transported, in a direction transverse to the transport direction.

The strip-shaped support can be tautented in a direction transverse to the transport direction thereby, a longitudinal side of the strip-shaped support being held and the other longitudinal side of the strip-shaped support being displaced transverse to the transport direction until the strip-shaped carrier is flat. The positions of the patterns in a direction transverse to the transport direction are determined in relation to the held longitudinal side.

Another embodiment of the device according to the invention is characterized in that the device is provided with a monitoring and control device for determining the positions of patterns relative to indexing holes situated in the vicinity of the imaging device from pictures made by means of the imaging device.

The position of the pattern on which a component is to be placed in relation to the component placement device can be calculated from the positions of the patterns relative to the indexing holes situated in the vicinity of the imaging device.

Figure 2:
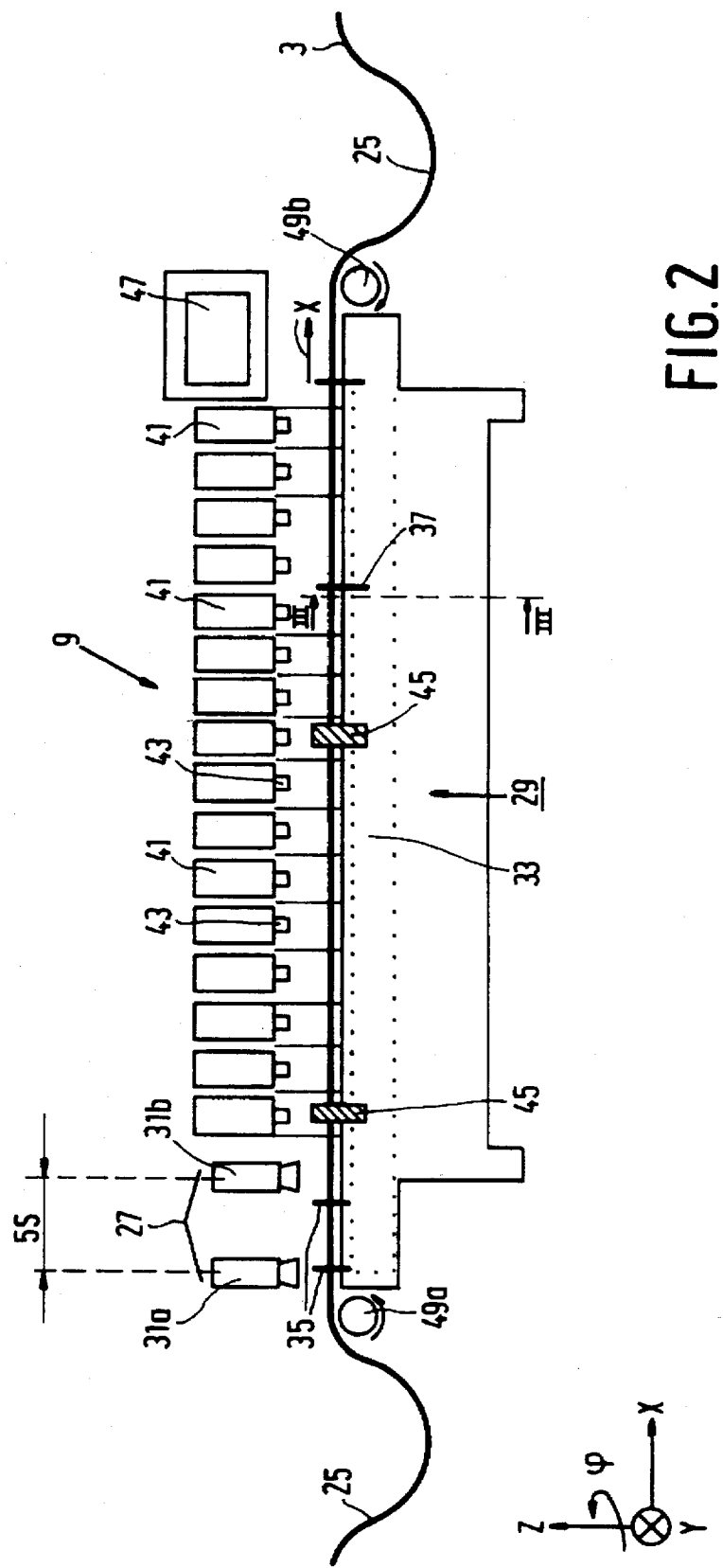
Figure 3:
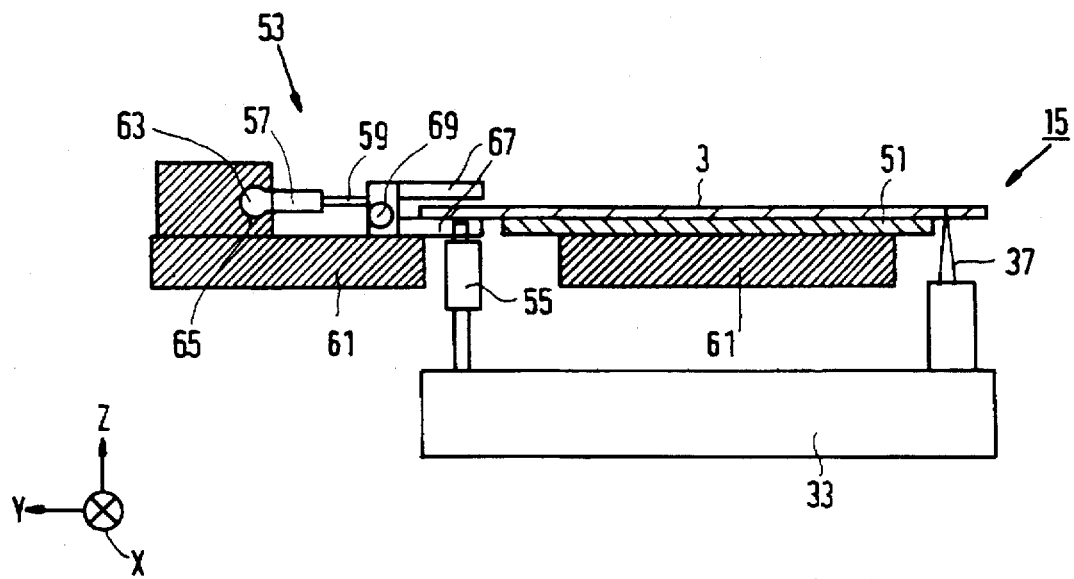
Figure 5:
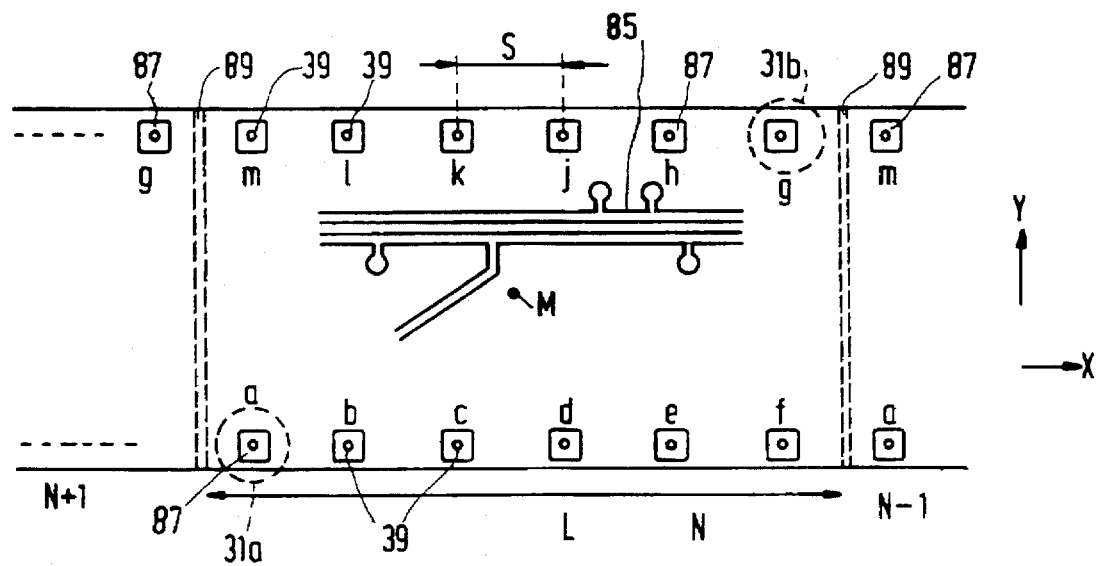

The invention will be explained in more detail with reference to the drawing in which FIG. 1 is a diagrammatic side elevation of a device according to the invention with fringe equipment, FIG. 2 shows the device depicted in FIG. 1, FIG. 3 is a cross-section of the device shown in FIG. 1, FIGS. 4a and b show a transport device forming part of the device of FIG. 1, and FIG. 5 is a plan view of a strip-shaped support.

Corresponding components have been given the same reference numerals in the various Figures.

FIG. 1 shows a device 1 for placing and fastening electronic components on a flexible strip-shaped support (foil) 3, for example made of polyimide, provided with a repetitive pattern. The device 1 is provided with a delivery stand 5, a printing device 7, a component placement device 9, an oven 11, a testing device 13, and a receiving stand 15. The foil 3 wound on a reel 17 is passed over a shaft 19 of the delivery stand 5. The unreeled foil 3 is provided with a soldering paste in a printing device 7 by means of a stencil. The foil 3 is provided with components in the component placement device 9, after which the components are connected to the foil 3 in the oven 11 after melting of the soldering paste, whereby electrical circuits are formed. The electrical circuits formed on the foil 3 are subsequently tested in the testing device 13. Finally, the foil 3 is wound into a roll 23 on a shaft 21 of the receiving stand 15. The delivery stand 5, printing device 7, oven 11, testing device 13, and receiving stand 15 are devices which are known per se. Buffers are formed between the various devices by means of loops 25 in the foil 3, so that with a defect in one of the devices the other devices can continue operating for some time before aim these devices have to be stopped. The lengths of the loops are so chosen that the buffer is not exhausted in the case of an average interruption caused by a defect. Optical sensors monitor the minimum and maximum admissible loop lengths, so that the devices can be stopped, accelerated or decelerated in time. Any fracture in the foil 3 is also detected by optical sensors.

FIG. 2 shows a device according to the invention which is provided with the component placement device 9, an imaging device 27 and a transport device 29 for transporting the foil 3 in a transport direction X. The imaging device 27 is situated between the printing device 7 and the component placement device 9 and is provided with two cameras 31. The transport device 29 is provided with a transport beam 33 on which positioning pins 35 and transport pins 37 are fastened. The positioning pins 35 are arranged in the vicinity of the cameras 31. The interspacing between two adjacent positioning pins 35 or transport pins 37 is equal to the nominal pitch between two indexing holes 39 (see FIG. 5) of the foil 3. The component placement device 9 is provided with sixteen placement modules 41 arranged next to one another, each provided with a placement head 43 and a component feed magazine 45. Each placement head 43 is displaceable over the full width of the foil (transverse to the plane of drawing) and over a comparatively small distance in the transport direction X, and is rotatable about an axis transverse to the foil 3. The placement head 43 is suitable for picking up a component from the magazine 45 and placing the component on the foil 3. The component placement device 9 comprises a monitoring device 47 for determining the relative positions of the patterns on the foil 3 from pictures made by the imaging device 27, and for determining the positions of the patterns relative to the placement heads 43. The component placement device 9 is further provided with friction rollers 49a, b for guiding and tensioning the foil 3 at the beginning and the end of the component placement device 9. The friction roller 49a at the beginning of the component placement device 9 turns in an anticlockwise direction, so that the foil 3 is tautened between the roller 49a and the first positioning pin 35 as seen in the transport direction. The friction roller 49b at the end of the component placement device 9, which turns in clockwise direction, tensions the foil 3 between the roller 49b and the last transport pin 37 as seen in the transport direction.

FIG. 3 is a cross-section of the transport device 29 shown in FIG. 2 provided with a support plate 51 for supporting the foil 3 during the placement of components on the foil 3. The support plate 51 comprises a metal plate on which a rubber layer is provided. The rubber layer reduces forces exerted on the components during the placement of the components on the foil 3. The transport device 29 is further provided with a clamping mechanism 53 which is connected at one side to the transport beam 33 via a pin 55, and at another side to a frame 61 of the component placement device 9 via a piston 59 displaceable in a cylinder 57. The cylinder 57 is connected to a guide element 63 which lies in a guide groove 65 of the frame 61, so that the cylinder 57 with the clamping mechanism 53 and the transport beam 33 is displaceable in an x-direction relative to the frame 61. The clamping mechanism 53 is fitted with two elongate plates 67 which are pivotable relative to one another about a spindle 69 and between which the foil 3 can be clamped. The spindle 69 is connected to the piston 59. When the cylinder 57 is energized, the piston 59 is displaced in the cylinder 57 and the clamping mechanism 53 is pulled in the positive y-direction. The foil 3 which lies on the transport pins 37 with the indexing holes 39 at a longitudinal side is tautened in the y-direction by the clamping mechanism 53. During the displacement of the clamping mechanism 53 in the x- or y-direction, the lower plate 67 slides over the frame 61.

Transport of the foil 3 in the transport direction X takes place as follows. The transport beam 33 is displaceable in the x-direction by means of a conventional servomotor with transmission, an angular encoder on the shaft of the servomotor determining accurately the position of the transport beam in the x-direction. The transport beam 33 is displaceable in the z-direction by means of a second servomotor. This servomotor is also provided with an angular shaft encoder with which the position of the transport beam 33 in the z-direction is determined. The transport beam 33 has been displaced in the z-direction into a highest position in which the positioning pins 35 and the transport pins 37 are in indexing holes 39 (see FIG. 5) of the foil 3. The plates 67 are clamped around the foil 3. The transport beam 33 and the clamping mechanism 53 are displaced in the x-direction, so that the foil 3 is also displaced in the x-direction. The transport beam 33, positioning pins 35, transport pins 37, and the clamping mechanism 53 are intermittently displaced over a distance six times the pitch S in the x-direction. The transport beam 33 stands still for a moment after each accurate displacement over a pitch distance S. Stamp-type clamps 71 situated at the beginning and the end of the transport device 29 are then displaced by means of air cylinders, so that the clamps 71 press the foil 3 against the support plate 51. Then the foil 3 is released by the clamping mechanism 53 and the transport beam 33 is displaced in the negative z-direction until the positioning pins 35 and the transport pins 37 have left the indexing holes 39. The transport beam 33 and the clamping mechanism 53 are displaced over a distance of 6 S in the negative x-direction in one operation and subsequently displaced in the positive z-direction, so that first the positioning pins 35 and then the transport pins 37 are moved into different indexing holes 39. Since the positioning pins 35 are longer than the transport pins 37, the positioning pins 35 enter the indexing holes 39 earlier than do the transport pins 37. The clamps 71 are subsequently removed from the foil 3 and the clamping mechanism 53 is clamped around the foil 3 again.

FIGS. 4a and b show the transport device 29 of FIG. 1 in side elevation. The transport beam 33 is provided with positioning pins 35 fixedly connected to the transport beam and with transport pins 37 displaceable in the x-direction relative to the positioning pins 35. The transport pins 37 are fastened in pairs to a carrier block 73 which is displaceable relative to a support block 75 connected to the transport beam 33. A bearing 77 is arranged between the carrier block 73 and the support block 75. Each carrier block 73 is connected to a rod 79 provided with a piston 83 which is displaceable in an air cylinder 81. The cylinder 81 is fixedly connected to the transport beam 33. The transport pins 37 are brought into the indexing holes 39 of the foil 3 in the following manner. First the piston 83 is displaced into a left-hand position in the cylinder 81 by means of compressed air, so that the carrier block 73 with the transport pins 37 is displaced in a direction opposed to the transport direction. Then the air pressure in the cylinder 81 is lifted in that the cylinder 81 is brought into open connection with the ambient pressure. The piston 83 is capable of moving freely in the cylinder 81 in this situation. The transport beam 33 is then moved in the positive z-direction, so that the transport pins 37 enter the indexing holes 39. The transport pins 37 are conical so that the transport pins 37 can be inserted into the indexing holes 39 as long as the distance from the transport pin 37 to the centre of the indexing hole 39 is smaller than the radius of the indexing hole 39. During insertion of the transport pins 37 into the indexing holes 39, the transport pins 37 may be displaced in the transport direction by the foil 3. Compressed air is then forced into the cylinder 81, so that the piston 83 is moved in the transport direction and the foil 3 is tautened in the x-direction by the transport pins 37. The distance between the positioning pins 35 and the various carrier blocks 73 is thus adapted to a distance between the indexing holes 39 present around the positioning pins and transport pins, which may deviate from an expected distance owing to pitch tolerances. The positioning pins 35 enter indexing holes 39 of the foil 3 at both longitudinal sides and position the foil 3 in the x- and y-direction. The transport pins 37 enter the indexing holes 39 at one longitudinal side only.

FIG. 5 is a plan view of the foil 3 which is provided with two rows of indexing holes 39, the latter having a pitch 8. A repetitive pattern 85 and marks 87 around the indexing holes 39 have been provided on the foil 3. A mark 87 comprises a square made from the same material as the pattern 85 and provided on the foil 3 simultaneously with the conductor pattern. The pattern 85 has a fixed, accurately known position relative to the marks 87 provided simultaneously with the pattern. Each pattern 85 has a length L which is six times the pitch S. The patterns 85 are provided on the foil 3 one after the other, so that the distances between the patterns 85 and the orientation of the patterns 85 relative to one another are not always uniform. A transition area 89 lies between the individual patterns 85. The cameras 31 are so positioned that the one camera 31a records the indexing hole 39a and the mark 87 of a pattern 85 situated around this hole at the same moment as the other camera 31b records the indexing hole 39g and the mark 87 of the same pattern 85 around this latter hole. The shape of the mark 87 around the indexing hole 39g is different from that of the other marks 87 in order to facilitate detection of the beginning of a pattern 85.

The operation of the device is as follows. The positioning pins 35 have been inserted into the indexing holes 39 of a pattern 85 with number N. The positions of the positioning pins 35 relative to the cameras 31a, b have been stored in the control device 47 for various positions in which the transport beam 33 is stationary. Since the transport beam 33 is displaced intermittently six times over a pitch distance S, there are seven positions in which the transport beam 33 is stationary. It is once more noted for the sake of completeness that the transport beam with the positioning pins 35 and the transport pins 37 is displaced accurately and that the position of the transport beam 33 and of the positioning pins 35 in relation to the cameras 31 and the placement modules 41 of the component placement device 9 are accurately known. The position of a pattern 85 relative to the marks 87 provided simultaneously with the pattern are also accurately known. The position of the marks 87, and thus the position of the patterns 85 relative to the indexing holes 39, however, are unknown. The distance between the indexing holes 39 viewed over a number of patterns 85 is also unknown owing to the tolerances in the pitch S.

In a first phase, the camera 31b records the different shape of the mark 87 around the indexing hole 39g as a signal for the beginning of a pattern 85. The camera 31a observes the mark 87 around the indexing hole 39a. The positions of the marks 87 relative to the positioning pins 85 can be determined by means of the monitoring/control device 47 from the pictures made by the cameras 31a, b. The position of the pattern 85 relative to the positioning pins 35 can be calculated from the positions of the marks 87 relative to the positioning pins 35 and the known position of the pattern 85 relative to the marks 87. Since the indexing holes 39 are accurately positioned by the positioning pins 35, the positions of the marks 87 and of the pattern N relative to the indexing holes 39 are also known.

Subsequently a translation vector $T_n$ and a rotation matrix $R_n$ of the pattern N relative to the centre M of the pattern N are calculated. The translation vector $T_N$ gives the deviation of the position of the centre M of the pattern N from a position of the centre of a reference pattern stored in the control unit 47. The rotation matrix $R_N$ gives the angular deviation of the orientation of the pattern N from an orientation of the reference pattern stored in the control unit 47. Then the foil 3 is transported over a pitch distance S in the transport direction X by means of the transport beam 33, the positioning pins 35 remaining in the same indexing holes 39. The foil 3 is transported over a distance S each time by the transport beam 33 in phases 2, 3, 4 and 5, during which the positioning and transport pins 35, 37 remain in the same indexing holes 39 of the foil 3. Since the transport beam 33 is displaced in an accurate manner, the positions of the positioning pins 35, of the marks 37, and of the pattern N relative to the cameras 31 and the placement modules 41 of the component placement device 9 can be accurately determined.

In phase 6, the foil 3 is once more transported over a distance S by the transport beam 33, so that the indexing hole 39g of pattern N+1 is brought below the camera 31b. The position of the mark 87g of pattern N+1 relative to the camera 31b is determined by means of the camera 31b. Then the foil 3 is pressed against the support plate 51 by the clamps 71, upon which the transport beam 33, which had been transported over a distance 6×S during the above six phases, is displaced in the negative z-direction and then in the negative x-direction over a distance 6 S in one operation. The transport beam 33 is then moved in the positive z-direction, the positioning pins 35 are brought into the indexing holes 39 of pattern N+1, the transport pins 37 are brought into other indexing holes 39, and the clamps 71 are lifted from the foil. The indexing holes 39 of the pattern N+1 are aligned with the positioning pins 35 by the positioning pins 35, and the foil 3 is positioned. Then the foil 3 is tensioned by the transport pins 37. Owing to tolerances in the distances between the indexing holes 39 at pattern N and the indexing holes at pattern N+1, the foil 3 will be displaced in the x-direction during the alignment of the indexing holes 39 of pattern N+1 on the positioning pins 35. Depending on the deviation between the expected and the actual distance between the indexing holes, the foil 3 will be pushed forward or pulled back. The camera 31b again pinpoints the position of the mark 87 around the indexing hole 39g relative to the camera 31b. The two pictures of the position of the mark 87 relative to the camera 31b made by the camera 31b renders it possible to calculate a displacement $V_{N,N+1}$ of the foil 3. This displacement $V_{N,N+1}$ is the result of deviations in the pitch between the indexing holes 39. The position of the pattern N relative to the positioning pins 35 inserted into the indexing holes 39 of pattern N+1 depends on the position of the pattern N relative to the indexing holes 39 situated in the vicinity of the pattern N and on the position of these indexing holes 39 relative to the indexing holes 39 situated around the positioning pins 35. The position of the pattern N relative to the indexing holes 39 situated in the vicinity of the pattern N is known from $T_N$, $R_N$, and the position of the indexing holes 39 relative to the indexing holes situated around the positioning pins 35 is known from $V_{N,N+1}$, $T_N$ and $R_N$. The position of the pattern N relative to the positioning pins 35 and to the placement modules 41 of the component placement device can be calculated from $V_{N,N+1}$, $T_N$ and $R_N$. The position of pattern N relative to pattern N+2 can be calculated in the same manner from $V_{N+1,N+2}$, $V_{N,N+1}$, $T_N$ and $R_N$, in which $V_{N+1,N+2}$ is the displacement occurring during alignment of the indexing holes 39 of the pattern N+2 instead of the indexing holes 39 of the pattern N+1. The position of a pattern 85 relative to the placement module 41 below which this pattern 85 is situated can be calculated from the position of a pattern 85 relative to the positioning pins 35 and the known position of the positioning pins 35 relative to the placement modules 41.

The moment the pattern N lies below a placement module 41, the deviation from an expected position of the pattern 85 lying below the placement module 51 is passed on, so that the component can be placed in the correct position by the placement head 43. The placement head 43 here performs an adapted displacement in the x,y-direction and a rotation in a $\phi$-direction depending on the deviations from the pattern position compared with the position of the reference pattern. The deviation from an expected position of the pattern present below the placement module 41 is passed on to the relevant placement module 41 each time. The placement modules 41 simultaneously place components on all patterns 85 present in the component placement device. A pattern 85 has been completely provided with components at the end of the component placement device 9.

In a device according to the invention, the pitch S was 50 mm and the pitch between the placement modules 41 was 120 mm, each placement module 41 being capable of placing components over a range of 80 mm in the x-direction.

It is possible for portions of two adjacent patterns to be present simultaneously below one placement module 41. The deviations of both patterns are then passed on to the placement module 41, and an adapted movement is carried out by the placement module 41 tailored to that pattern on which a component is to be placed.

To determine the displacement V, it is alternatively possible to use the position of the indexing hole 39g relative to the camera 31b instead of the position of the mark 87 relative to the camera 31b. It is also possible to determine both the position of the indexing hole 39g relative to the camera 31b and the position of the indexing hole 39a relative to the camera 31a, whereby not only a displacement but also a rotation can be measured.

An alternative operation of the device is the following. We start with a situation in which foil 3 is already present in the component placement device 9. The positioning pins 35 are in the indexing holes 39 of a pattern 85 having number N.

In a first phase, the presence of a new pattern 85 is detected by the cameras 31. Then the position of the pattern N relative to the indexing holes 39a and 39g is determined, and a translation vector $T_N$ and a rotation matrix $R_N$ of the pattern N relative to the centre M of the pattern N are calculated. The foil 3 is then transported in the transport direction X over a pitch distance S. Components are placed on the patterns present in the component placement device 9.

In phase 2, the position of the mark 87h of pattern N relative to the mark 87f of pattern N+1 is determined by the cameras 31a, b, after which the foil 3 is transported over a distance S and components are placed on the patterns again.

The phases 3, 4, 5 and 6 are identical to phase 2, except for the fact that in phase 3 the position of the mark 87j of pattern N relative to the mark 87e of pattern N+1 is determined, in phase 4 the position of the mark 87k of pattern N relative to the mark 87d of pattern N+1 is determined, in phase 5 the position of the mark 87l of pattern N relative to the mark 87c of pattern N+1 is determined, and in phase 6 the position of the mark 87m of pattern N relative to the mark 87o of pattern N+1 is determined. An average position vector $P_{N,N+1}$ is calculated from the five measured positions of the pattern N relative to pattern N+1. In the subsequent first phase, the position of the pattern N+1 relative to the indexing holes 39a, g of pattern N+1 is then determined, and a translation vector $T_{N+1}$ and a rotation matrix $R_{N+1}$ of the pattern N+1 relative to the centre M of the pattern N+1 are calculated. The position of the pattern N relative to the positioning pins 35 situated in indexing holes 39 of pattern N+1 can be calculated from $P_{N,N+1}$, $T_N$, $T_{N+1}$, $R_N$ and $R_{N+1}$.

The number of transport pins 37 may be equal to the number of indexing holes 39 at the area of the component placement device. It is alternatively possible, however, to use only a limited number of transport pins 37, as indicated in FIG. 4a.

Although the invention was described with reference to a flexible foil, it is also possible to provide an elongate rigid printed circuit board (for example, 1 m long) with components by means of the method and device according to the invention.

I claim:

1. A method of placing components on a strip-shaped flexible support which is transported intermittently through a component placement device, said support being provided with indexing holes with a pitch S and a plurality of repetitive circuit patterns, each pattern lying in a region in which a series of indexing holes are located and which support comprises at least one mark situated in said region, said mark having a known relative position with respect to its corresponding pattern, said components being placed on the circuit pattern by means of a placement head, said method comprising the following steps:

a) positioning a part of the support having a first pattern with respect to an image device by means of positioning pins which are inserted in indexing holes, b) making an image of the mark belonging to the first pattern with the image device, c) transporting the support over a defined distance such that, seeing in a transport direction, a next part of the support having a second pattern is situated underneath the image device, d) making an image of the mark belonging to the second pattern with the image device, e) withdrawing the positioning pins from the indexing holes, f) transporting the positioning pins back to said next part of the support, while leaving the support in situ, g) positioning said next part of the support having the second pattern with respect to the image device by inserting the positioning pins in the indexing holes, h) making an image of the mark belonging to the second pattern with the image device, i) calculating the position of the first pattern with respect to the placement head and calculating the relative position of the first pattern with respect to the second pattern from the data of the images.

2. A method as claimed in claim 1, wherein the position of the first pattern relative to the second pattern is determined for different positions in relation to the image device, after which an average relative position is calculated.

3. A method as claimed in claim 1, wherein the support is tightened in the transport direction.

4. A device for placing components on a strip-shaped flexible support which is provided with indexing holes with a pitch S and a plurality of circuit pattern, which device is provided with an image device, a component placement head for placing components on the support, and a transport device for transporting the strip-shaped support in a transport direction, which transport device is provided with a transport beam having positioning pins cooperating with the indexing holes of the support for positioning the support relative to the image device, said transport beam being further provided with transport pins cooperating with the indexing holes of the support for transporting the support in the transport direction, said transport pins being movable in the transport direction relative to the positioning pins, said transport beam having means for moving the transport pins to tighten the support in the transport direction.

5. A device as claimed in claim 4, wherein the means for moving the transport pins to tighten the support comprises a carrier block on which the transport pins are secured, said carrier block being movable along the transport beam by pneumatic means.

6. A device as claimed in claim 4, wherein the device is provided with clamping mechanism for tautening the support in a direction transverse to the transport direction.

* * * * *